(12) United States Patent
Dvorak et al.

(10) Patent No.: US 8,461,902 B2
(45) Date of Patent: Jun. 11, 2013

(54) MULTIPLEXER CIRCUIT WITH LOAD BALANCED FANOUT CHARACTERISTICS

(75) Inventors: Josef A. Dvorak, Ft. Collins, CO (US); Edward Chang, Ft. Collins, CO (US); Douglas R. Williams, Mountain View, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 163 days.

(21) Appl. No.: 13/015,371

(22) Filed: Jan. 27, 2011

(65) Prior Publication Data

US 2012/0194250 A1 Aug. 2, 2012

(51) Int. Cl.
*H03K 17/00* (2006.01)

(52) U.S. Cl.
USPC ............ 327/408; 327/540; 327/407; 327/537

(58) Field of Classification Search
USPC .................................. 327/407, 408; 370/537
See application file for complete search history.

(56) References Cited

U.S. PATENT DOCUMENTS

| | | | | |
|---|---|---|---|---|
| 5,815,024 A | * | 9/1998 | Reddy et al. | 327/408 |
| 5,936,426 A | * | 8/1999 | Wilson et al. | 326/49 |
| 6,323,690 B1 | * | 11/2001 | Yamashita et al. | 326/113 |
| 6,806,732 B1 | * | 10/2004 | Kaviani | 326/39 |
| 6,982,589 B2 | * | 1/2006 | Veeramachaneni et al. | 327/408 |
| 7,053,654 B1 | * | 5/2006 | Young et al. | 326/44 |
| 7,636,007 B2 | * | 12/2009 | Wakayama et al. | 327/408 |
| 2002/0041198 A1 | * | 4/2002 | Parris et al. | 327/408 |
| 2005/0035810 A1 | * | 2/2005 | Mulder et al. | 327/408 |
| 2007/0195831 A1 | * | 8/2007 | Tanaka | 370/537 |

* cited by examiner

*Primary Examiner* — Ryan Jager
(74) *Attorney, Agent, or Firm* — Ingrassia Fisher & Lorenz, P.C.

(57) ABSTRACT

A multiplexer (MUX) circuit with balanced select line loading is provided. The MUX circuit includes a plurality of 2:1 MUX units coupled together in a multistage cascading arrangement, along with a selection module coupled to the MUX units. The MUX units are arranged in an initial MUX stage, at least one intermediate MUX stage coupled to and following the initial MUX stage, and a final MUX stage coupled to and following the at least one intermediate MUX stage. Each MUX unit is controlled with a respective select bit input value provided by the selection module. The selection module controls the operation of the MUX units in the initial MUX stage with a first plurality of different select bits, controls the operation of the MUX units in the at least one intermediate MUX stage with a second plurality of different select bits, and controls the operation of the final MUX stage with a devoted select bit.

19 Claims, 4 Drawing Sheets

MULTIPLEXER CIRCUIT WITH LOAD BALANCED FANOUT CHARACTERISTICS

TECHNICAL FIELD

The subject matter described herein relates to a multiplexer circuit. More particularly, the subject matter relates to a multistage multiplexer circuit having balanced select line loading associated with the different stages.

BACKGROUND

Multiplexer (MUX) circuits are commonly used in various applications, including digital logic applications, microprocessor applications, data communication applications, and the like. One type of MUX circuit accommodates a large number of input bits and selects one of the input bits as the output. The output is selected using the appropriate amount of select bits. For example, in an 8:1 MUX circuit, three select bits are used to select one of the eight possible input bits for use as the output bit. Similarly, a 32:1 MUX circuit employs five select bits.

Large scale MUX circuits may be arranged in a multistage manner where each stage includes one or more MUX units. For example, an 8:1 MUX circuit can be arranged using seven MUX units arranged in three stages: an initial stage having four MUX units; an intermediate stage having two MUX units; and a final stage having only one MUX unit. According to established conventions, the input bits selected by the MUX units in the initial stage are controlled using one common select bit, the input bits selected by the MUX units in the intermediate stage are controlled with another common select bit, and the input bit selected by the MUX unit in the final stage is controlled with yet another select bit. For very large scale MUX circuits, the fanout (loading) associated with the select bit lines for the different stages can be significantly different. Thus, the propagation delay associated with the operation of the initial stage can become a limiting factor in the overall performance of conventional multistage MUX circuits.

BRIEF SUMMARY OF EMBODIMENTS

An exemplary embodiment of a MUX circuit is provided. The MUX circuit includes an initial MUX stage and a final MUX stage coupled to the initial MUX stage. The initial MUX stage includes a plurality of initial stage MUX units to receive a plurality of input bits, and each of the plurality of initial stage MUX units has a respective select bit input. The initial MUX stage is controlled with at least a first select bit and a second select bit assigned to the select bit inputs of the initial stage MUX units. The final MUX stage has a final stage MUX unit to provide one of the plurality of input bits as an output bit. The final stage MUX unit has a respective select bit input, and the final MUX stage is controlled with at least a third select bit assigned to the select bit input of the final stage MUX unit.

Another exemplary embodiment of a MUX circuit includes an initial MUX stage, an intermediate MUX stage, and a final stage MUX unit. The initial MUX stage includes a plurality of initial stage MUX units to receive a plurality of input bits, and the initial MUX stage is controlled with a first plurality of different select bits. The intermediate MUX stage is coupled to the initial MUX stage, and it includes a plurality of intermediate stage MUX units. The intermediate MUX stage is controlled with a second plurality of different select bits. The final stage MUX unit is coupled to the intermediate MUX stage to provide one of the plurality of input bits as an output bit. The final stage MUX unit is controlled with a final stage select bit that is distinct from any of the first plurality of different select bits and any of the second plurality of different select bits.

Yet another exemplary embodiment of a MUX circuit is also provided. The MUX circuit includes a plurality of 2:1 MUX units coupled together in a multistage cascading arrangement comprising an initial MUX stage, at least one intermediate MUX stage coupled to and following the initial MUX stage, and a final MUX stage coupled to and following the at least one intermediate MUX stage. Each of the MUX units is controlled with a respective select bit input value. The MUX circuit also includes a selection module coupled to the MUX units. The selection module controls the operation of the MUX units in the initial MUX stage with a first plurality of different select bits, controls the operation of the MUX units in the at least one intermediate MUX stage with a second plurality of different select bits, and controls the of the final MUX stage with a devoted select bit.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Figure 1:
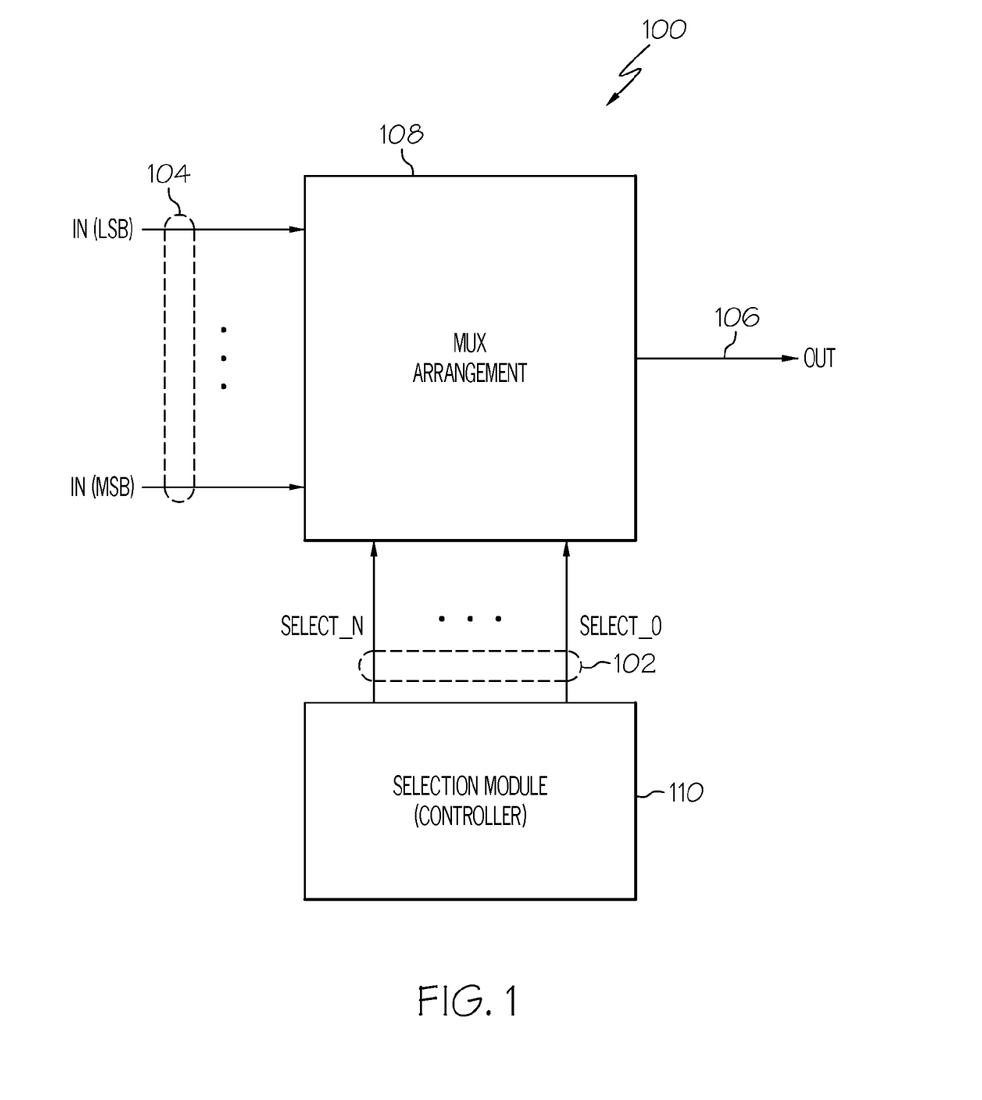
FIG. 1 is a block diagram of an exemplary embodiment of a MUX circuit.

FIG. 1 is a block diagram of an exemplary embodiment of a MUX circuit 100. In accordance with conventional designs, the MUX circuit 100 uses a select address 102 to determine which bit of input data 104 to select for the output 106 of the MUX circuit 100. For instance, a 32 to 1 (32:1) MUX circuit selects one of its 32 input bits using a five-bit select address, and a 128:1 MUX circuit selects one of its 128 input bits using a seven-bit select address. The MUX circuit 100 may include a MUX arrangement 108 and a selection module 110 that controls the operation of the MUX arrangement 108. Although FIG. 1 depicts the MUX arrangement 108 and the selection module 110 coupled together as two distinct blocks, an implementation of the MUX circuit 100 may integrate the functionality of the MUX arrangement 108 and the selection module 110.

The MUX arrangement 108 receives the input data 104 in the form of a plurality of input bits. For ease of understanding, FIG. 1 depicts the input data 104 ordered from the least significant bit (LSB) at the top and the most significant bit (MSB) at the bottom. In practice, however, the input data 104 could be ordered in an alternative manner. The selection module 110 provides the select address 102 in the form of a plurality of select bits. FIG. 1 shows the select address 102 (having N−1 bits) ordered from the LSB at the right and the MSB at the left. In practice, however, the select address 102 could be ordered in an alternative manner. The selection module 110 may be controlled in a conventional manner to generate a particular select address 102 at the appropriate time to force the MUX arrangement 108 to select the desired input bit as the output 106. Thus, the selection module controls the operation of the MUX arrangement 108 by changing the select address 102 as needed.

For typical standard cell-based designs, large MUX circuits are realized from a plurality of "basic" MUX units, such as 2:1 MUX units. For example, an 8:1 MUX circuit can be created from seven 2:1 MUX units coupled together in a multistage cascading arrangement (four MUX units in the initial stage, two MUX units in the second stage, and one MUX unit in the final stage). Similarly, a 32:1 MUX circuit can be created from 31 2:1 MUX units coupled together in a multistage cascading arrangement. Such conventional MUX circuits use numerical ordering of input bits and a decreasing number of MUX units with increasing stages.

Figure 2:
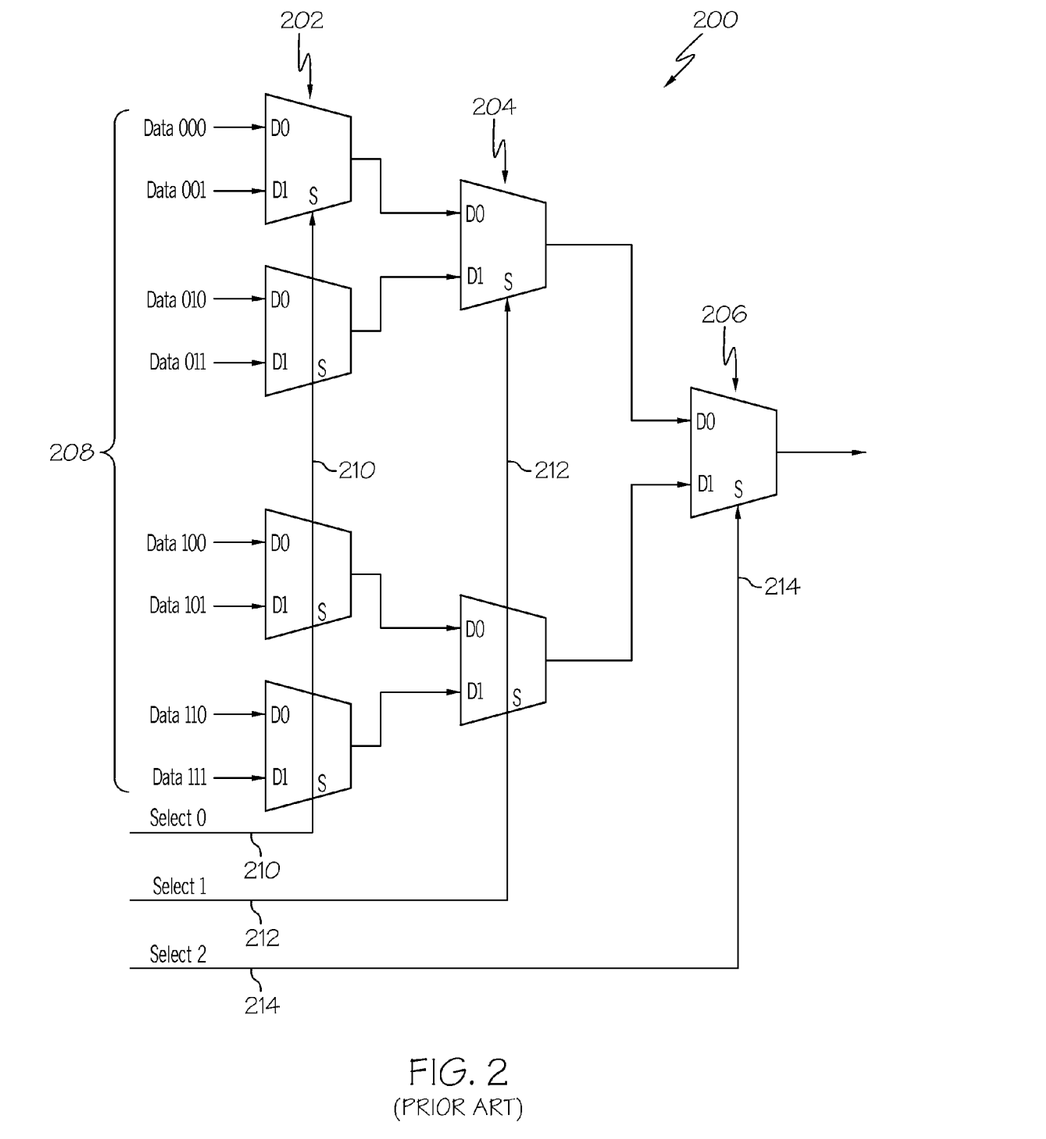
FIG. 2 is a schematic representation of a conventional 8:1 MUX circuit.

FIG. 2 is a schematic representation of a conventional 8:1 MUX circuit 200. The MUX circuit 200 is based on the typical multistage arrangement described above. In this regard, the MUX circuit 200 is created from seven 2:1 MUX units. The initial MUX stage 202 has four MUX units, the second MUX stage 204 has two MUX units, and the final MUX stage 206 has only one MUX unit. The input data 208 enters the MUX units of the initial MUX stage 202 in numerical order (LSB at the top and MSB at the bottom). Notably, all of the MUX units in the initial MUX stage 202 are controlled with a common select bit (labeled Select0) on a common select line 210. Similarly, all of the MUX units in the second MUX stage 204 are controlled with a common select bit (labeled Select1) on a common select line 212. The lone MUX unit in the final MUX stage 206 is controlled with a devoted select bit (labeled Select2) on a select line 214.

The MUX circuit 200 experiences uneven select line loading, which can hinder performance and introduce undesirable propagation delay. In this regard, unbalanced loading results because the select line 210 (for Select0) is coupled to four different MUX units, while the select line 212 (for Select1) is coupled to only two different MUX units and the select line 214 (for Select2) is coupled to only one MUX unit. This type of loading disparity on standard designs is even more pronounced with larger MUX circuits. For example, a 128:1 MUX circuit would have the Select0 line driving 64 2:1 MUX units, the Select1 line driving 32 2:1 MUX units, the Select2 line driving 16 2:1 MUX units, and so on.

The techniques and technology presented here addresses the uneven select line loading of conventional designs by reordering the select bits for larger MUX circuits (e.g., 8:1 and larger) to better balance the number of MUX units driven by a single select bit, and by rearranging the input data bits to reduce the amount of wiring needed to implement the MUX circuits. This approach effectively reorders the fanout of later MUX stages in a way that "hides" the load time associated with the initial MUX stage, which represents a limiting factor in conventional designs.

Figure 3:
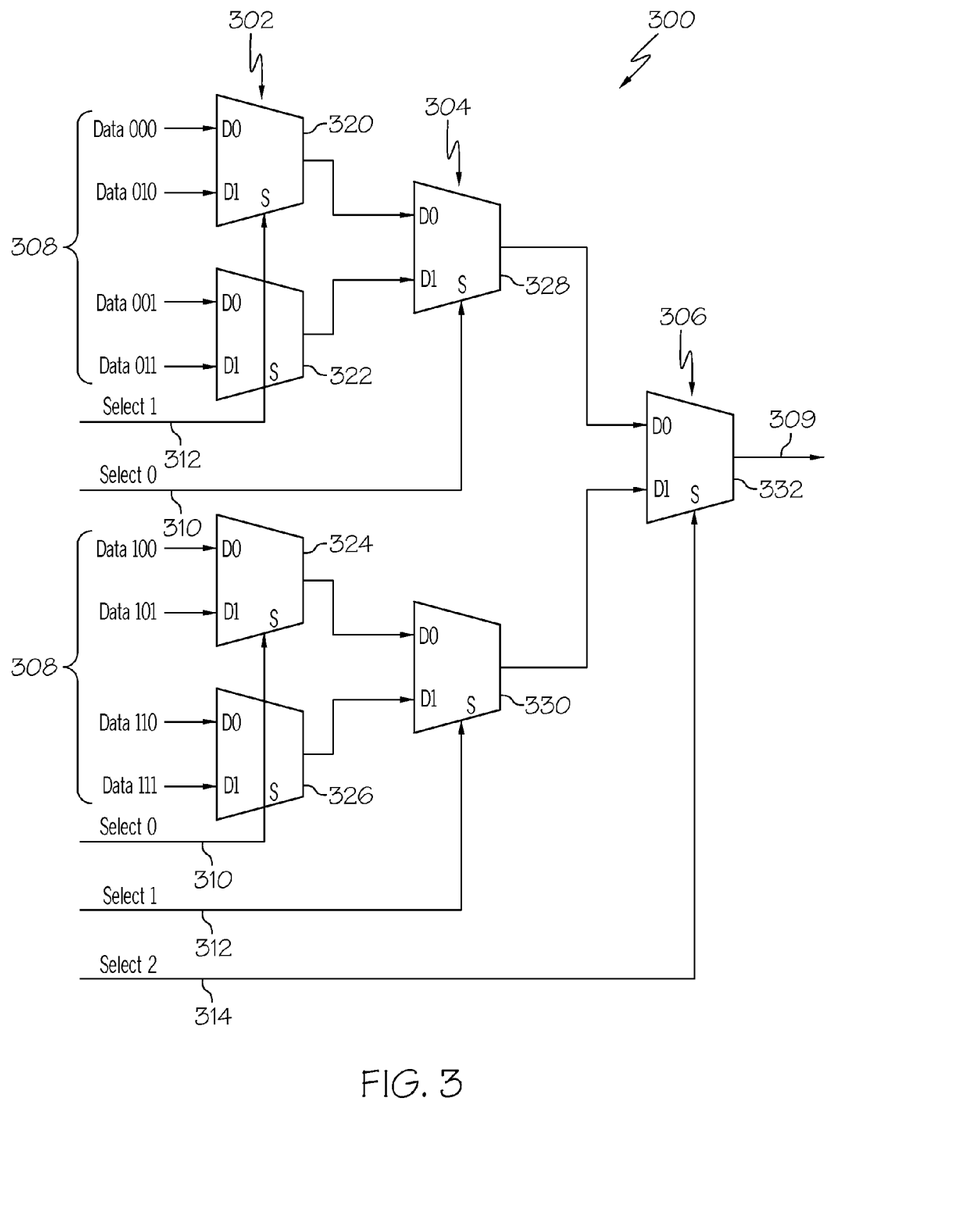
FIG. 3 is a schematic representation of an exemplary embodiment of an 8:1 MUX circuit that employs load balancing.

FIG. 3 is a schematic representation of an exemplary embodiment of an 8:1 MUX circuit 300 that employs load balancing. Referring back to FIG. 1, the MUX arrangement 108 may be configured as shown in FIG. 3. An 8:1 implementation is presented here for the sake of brevity and ease of understanding. It should be appreciated that the principles and approach described here can be extended to larger MUX circuit topologies, such as 64:1, 128:1, and larger. The MUX circuit 300 performs the same logic function as the conventional MUX circuit 200 shown in FIG. 2. In other words, the MUX circuits 200, 300 will generate the same output, given the same input data and the same select address. Indeed, the MUX circuits 200, 300 both accommodate eight input bits, select the output using a three-bit select address, and include seven 2:1 MUX units.

The illustrated embodiment of the MUX circuit 300 includes a plurality of 2:1 MUX units coupled together in a multistage cascading arrangement. More specifically, the MUX circuit 300 includes an initial MUX stage 302 having a plurality of initial stage MUX units, an intermediate MUX stage 304 coupled to and following the initial MUX stage 302 and having a plurality of intermediate stage MUX units, and a final MUX stage 306 coupled to and following the intermediate MUX stage 304 and having a final MUX stage unit. The initial MUX stage 302 receives eight bits of input data 308, and the final MUX stage 306 provides one output bit 309. The output bit 309 corresponds to one bit of the input data 308, as selected by a three-bit select address (i.e., the Select0 bit on the select line 310, the Select1 bit on the select line 312, and the Select2 bit on the select line 314). For this 8:1 implementation, the initial MUX stage 302 includes four different MUX units 320, 322, 324, 326, the intermediate MUX stage 304 includes two different MUX units 328, 330, and the final MUX stage includes one MUX unit 332. In larger MUX circuit implementations, the initial MUX stage includes more than four MUX units, and two or more intermediate MUX stages are coupled between the initial and final MUX stages.

The MUX units in the MUX circuit 300 are cascaded such that outputs of earlier stage MUX units correspond to inputs of later stage MUX units. In this regard, the output of each MUX unit in the initial MUX stage 302 represents an input to a MUX unit in the intermediate MUX stage 304. Likewise, the output of each MUX unit in the intermediate MUX stage 304 represents an input to the MUX unit in the final MUX stage 306.

Each MUX unit is controlled with a respective select bit input value (one or zero) carried on one of the three select lines 310, 312, 314. For this particular example, the Select0 bit (on the select line 310) controls the operation of the MUX units 324, 326, 328, the Select1 bit (on the select line 312) controls the operation of the MUX units 320, 322, 330, and the Select2 bit (on the select line 314) controls the operation of the MUX unit 332. Notably, the initial MUX stage 302 is controlled with a plurality of select bits (e.g., the values of Select0 and Select1) that are assigned to and delivered on a plurality of different and distinct select lines (e.g., the select lines 310, 312). In contrast, the conventional design described above and shown in FIG. 2 controls all of the MUX units in the initial MUX stage 202 with one and only one select line, namely, the Select0 select line 210. Likewise, the intermediate MUX stage 304 is controlled with a plurality of select bits (e.g., the values of Select0 and Select1) that are assigned to and delivered on a plurality of different and distinct select lines (e.g., the select lines 310, 312). Moreover, for this architecture a given select bit (e.g., Select0 or Select1) may be distributed across a plurality of different MUX stages (other than the final MUX stage). Although the illustrated embodiment has Select0 and Select1 distributed across two different MUX stages 302, 304, other embodiments may have one or more select lines spanning more than two different MUX stages. In contrast, the conventional design described above and shown in FIG. 2 uses one and only one select line per MUX stage.

The MUX unit 332 of the final MUX stage 306, however, is controlled with a select bit (e.g., the value of Select2) delivered on a devoted select line (e.g., the select line 314). In this regard, the MUX unit 332 is controlled with a final stage select bit (Select2) that is distinct from and different than any of the select bits used for the initial MUX stage 302 and the intermediate MUX stage 304. In other words, Select2 is devoted to the MUX unit 332, and Select2 is not used to control any other MUX units in the MUX circuit 300.

Although the same two select lines 310, 312 are used to control both the initial MUX stage 302 and the intermediate MUX stage 304, other embodiments need not share the same select lines in this manner. Indeed, for larger MUX circuits, different sets of select lines can be used to control multiple intermediate MUX stages between the initial and final MUX stages. Accordingly, the plurality of select bits in any two MUX stages (other than the final MUX stage) may be the same, they may share at least one select bit, or they may be mutually exclusive with no common select bits.

Referring again to FIG. 1, the data inputs to the MUX units in the MUX arrangement 108 are configured, and the selection module 110 is operated, such that the selection module 110 distributes select line loading for the MUX circuit 300. In this regard, the MUX circuit 300 uses reordered select bits and reordered input bits (relative to the conventional implementation that employs numerically ordered bits), which results in reordered fanout of the MUX stages 302, 304, 306. As shown in FIG. 3, the top-to-bottom ordering of the input data 308 is no longer numerically determined. Rather, the input data 308 has been reordered and reallocated to the different MUX units in the initial MUX stage 302 in a manner that achieves the intended digital logic function. Thus, instead of the least significant select bit always driving the first stage of MUX units, the MUX circuit 300 uses the least significant select bit (Select0) driving at least one MUX unit that appears in a later stage, namely, the MUX unit 328 in the intermediate MUX stage 304. Moreover, at least one MUX unit 320, 322 in the initial MUX stage 302 is driven by a select bit (Select1) having higher significance.

Depending on the size of the MUX circuit, the input and select bits can be reordered in various configurations to meet the particular design requirements. For instance, it may be desirable to achieve very even select bit loading in certain designs, while other designs may arrange some select bits to achieve certain timing requirements. The MUX circuit 300 (and other implementations that leverage the reordering and load balancing techniques described here) exhibits better load balancing of the MUX stages by increasing the loading of later stages while decreasing the loading of earlier stages. Consequently, the MUX circuit 300 reduces overloading on any one select line, which in turn avoids any critical timing paths relative to other select line signals.

Figure 4:
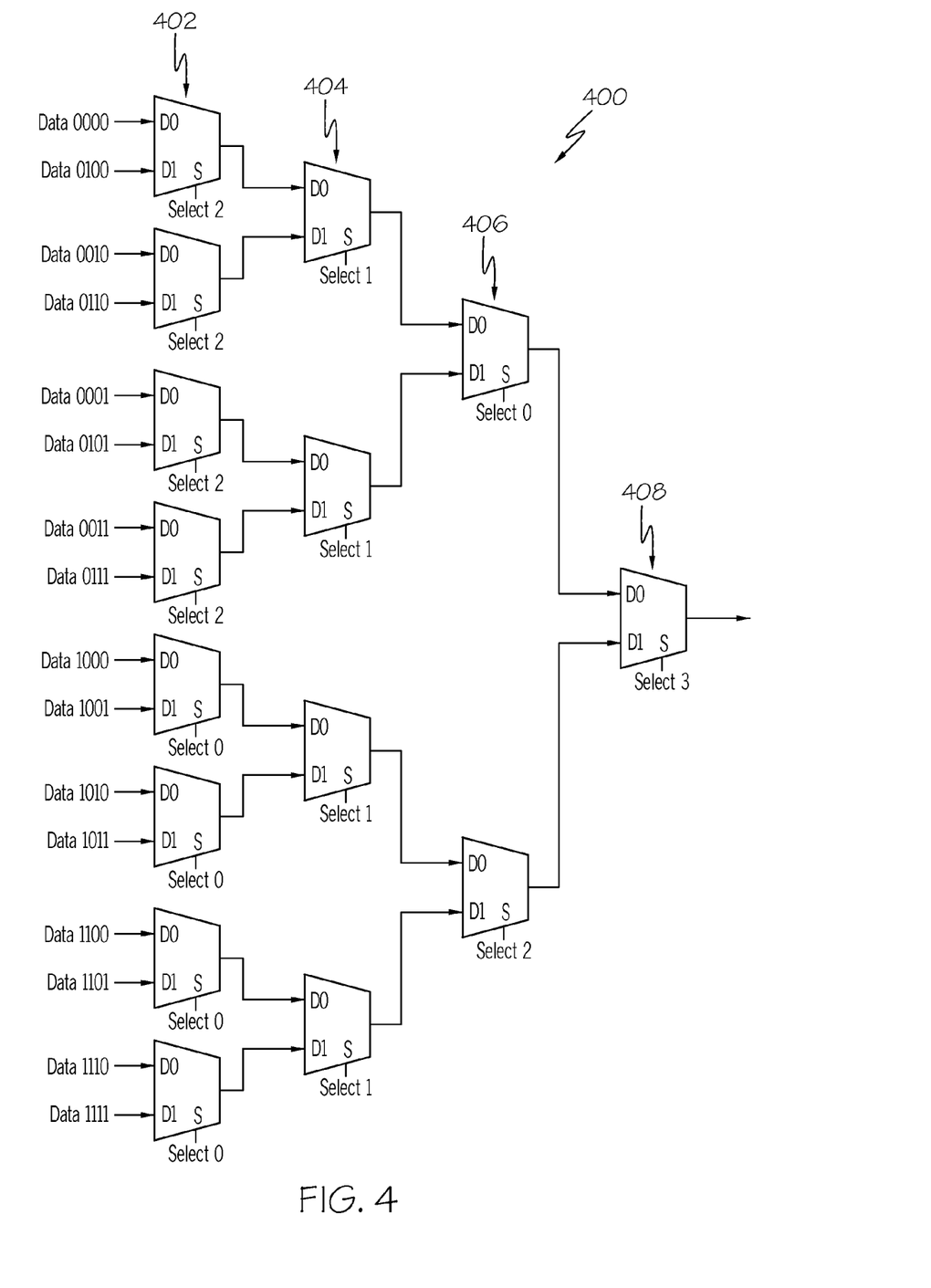
FIG. 4 is a schematic representation of an exemplary embodiment of a 16:1 MUX circuit that employs load balancing.

As another example, FIG. 4 is a schematic representation of an embodiment of a 16:1 MUX circuit 400 that employs load balancing. The MUX circuit 400 has four stages: an initial stage 402 having eight 2:1 MUX units; a second stage 404 having four 2:1 MUX units; a third stage 406 having two 2:1 MUX units; and a final stage 408 having one 2:1 MUX unit. The MUX circuit 400 employs four select lines 412, 414, 416, 418 to carry four different select bits (Select0, Select1, Select2, and Select3). Notably, the operation of the initial stage 402 is driven by a plurality of different select bits (namely, Select0 and Select2), the operation of the second stage 404 is influenced by the Select1 bit, the operation of the third stage 406 is determined by a plurality of different select bits (namely, Select0 and Select2), and the final stage 408 is controlled with a distinct and devoted select bit (namely, Select3). The resulting select line loading for this particular example is as follows: Select0 drives five MUX units; Select1 drives four MUX units; Select2 drives five MUX units; and Select3 drives one MUX unit.

As yet another example, the approach described above can be used with a 128:1 MUX circuit. One possible implementation of a 128:1 MUX circuit has the Select0 bit driving 33 MUX units, the Select1 bit driving 18 MUX units; the Select2 bit driving 12 MUX units, the Select3 bit driving 12 MUX units, the Select4 bit driving 18 MUX units, the Select5 bit driving 33 MUX units, and the Select6 bit driving one MUX unit (the final MUX stage).

The reordering and load balancing techniques described herein can also be extended for use with MUX circuits based on something other than a 2:1 MUX unit. For example, a MUX circuit that includes 4:1 MUX units may take advantage of the select line reordering technique to achieve better load balancing. Moreover, the approach presented here could be modified for use with MUX units having more than one output bit (e.g., an 8:2 MUX unit).

The design of a MUX circuit having balanced select line loading may involve a "transformation" from a conventional multilevel MUX circuit arrangement to the desired MUX circuit topology that performs the same logical function. Such a transformation begins with the particular cascaded arrangement of MUX units, reassigns the select bit inputs for the various MUX units, and reorders the data input bits at the initial stage of MUX units. An exemplary transformation technique will now be described for a 32:1 MUX circuit formed using 2:1 MUX units.

The conventional arrangement for the 32:1 MUX circuit is indicated below, where the parenthetical associated with a select bit identifies the stage and the top-to-bottom position of the particular MUX unit driven by that select bit. For example, the nomenclature "S1@(3,1)" means that the Select1 line/bit drives the MUX unit in the third stage, position one. For this example, stages are numbered sequentially beginning with zero (which represents the initial stage), and positions within a given stage are numbered sequentially beginning with zero.

d00 00000
d01 00001 S0@(4,0)
d02 00010
d03 00011 S0@(4,1) S1@(3,0)
d04 00100
d05 00101 S0(4,2)
d06 00110
d07 00111 S0(4,3) S1@(3,1) S2@(2,0)
d08 01000
d09 01001 S0(4,4)
d10 01010
d11 01011 S0@(4,5) S1@(3,2)
d12 01100
d13 01101 S0@(4,6)
d14 01110
d15 01111 S0@(4,7) S1@(3,3) S2@(2,0) S3@(1,0)

d16 10000
d17 10001 S0(4,8)
d18 10010
d19 10011 S0(4,9) S1@(3,4)
d20 10100
d21 10101 S0@(4,10)
d22 10110
d23 10111 S0@(4,11) S1@(3,5) S2@(2,0)
d24 11000
d25 11001 S0(4,12)
d26 11010
d27 11011 S0(4,13) S1@(3,6)
d28 11100
d29 11101 S0(4,14)
d30 11110
d31 11111 S0@(4,15) S1@(3,7) S2@(2,0) S3@(1,1) S4@(0,0)

For this conventional topology, the resulting select line loading is as follows. Select0 drives sixteen MUX units; Select1 drives eight MUX units; Select2 drives four MUX units; Select3 drives two MUX units; and Select4 drives one MUX unit (the final stage MUX unit). The unbalanced nature of the select lines is clearly indicated by this example.

For an arbitrary $2^N$ MUX tree based on 2:1 MUX units, N is the number of select lines/bits, and $2^N$ equals the number of data lines/bits. An exemplary transformation process may begin by choosing three numbers (n, m, and i), where:

m=layer closer to the output with single MUX to swap select lines;

i=position of the target MUX unit in layer m for select line swapping; and n=layer closer to the inputs for select line swapping.

The transformation process assumes that the following constraints apply:

i<$2^m$ (only $2^m$ MUX units in layer m); and n>m (n is closer to inputs, m is closer to outputs).

It is possible to swap $2^{n-m}$ MUX units from level n for one MUX unit on level m (labeled mux (m,i)), with reordered data lines. In this regard:

s=number of MUX units to swap select lines between layer n and layer m=$2^{n-m}$;

S(n)=select line on MUX units in layer (n);

S(m)=select line on MUX units in layer (m);

position of MUX units to swap in level m=Mm=S(m)(m,i) (only one MUX unit);

position of MUX units to swap in level n=Mn=S(n)(n, start), . . . S(n)(n,end);

start=$2^{n-m} \times i$;

end=$2^{n-m} \times (i+1)-1$.

For data reordering, swap bit values S(n) and S(m) in for all data lines (d) in ($2^{N-m} \times i, 2^{N-m} \times (i+1)-1$).

N=5 tree below shows two transformations:
n=4, m=2, i=1 (S(n)=0,S(m)=2,Mm=2@(2,1),Mn=0@(4,4), 0@(4,5),0@(4,6),(4,7)) n=4, m=1, i=1 (S(n)=0,S(m)=3, Mm=3@(1,1),Mn=0@(4,8),0@4,9), . . . 0@(4,15))
The result of these transformations is as follows:
d00 00000
d01 00001 S0@(4,0)
d02 00010
d03 00011 S0@(4,1) S1@(3,0)
d04 00100
d05 00101 S0@(4,2)
d06 00110
d07 00111 S0@(4,3) S1@(3,1) S2@(2,0)
d08 01000
d12 01100 S2@(4,4)
d10 01010
d14 01110 S2@(4,5) S1@(3,2)
d09 01001
d13 01101 S2@(4,6)
d11 01011
d15 01111 S2@(4,7) S1@(3,3) S0@(2,1) S3@(1,0)
d16 10000
d24 11000 S3@(4,8)
d18 10010
d26 11010 S3@(4,9) S1@(3,4)
d20 10100
d28 11100 S3@(4,10)
d22 10110
d30 11110 S3@(4,11) S1@(3,5) S2@(2,2)
d17 10001
d25 11001 S3@(4,12)
d19 10011
d27 11011 S3@(4,13) S1@(3,6)
d21 10101
d29 11101 S3@(4,14)
d23 10111
d31 11111 S3@(4,15) S1@(3,7) S2@(2,3) S0(1,1) S4@(0,0)

After these transformations have been made, the resulting select line loading is as follows. Select0 drives six MUX units; Select1 drives eight MUX units; Select2 drives seven MUX units; Select3 drives nine MUX units; and Select4 drives one MUX unit (the final stage MUX unit). The balance of the select line loading has improved relative to the conventional arrangement.

Thereafter, additional transformations can be performed as follows:
n=3, m=2, i=2 (S(n)=1,S(m)=2,Mm=2@(2,2),Mn=2@(3,4), 2@(3,5)) n=4, m=3, i=6 (S(n)=3,S(m)=1,Mm=1 @(3,6), Mn=3@(4,12),3@(4,13))

The result of these additional transformations is as follows:
d00 00000
d01 00001 S0@(4,0)
d02 00010
d03 00011 S0@(4,1) S1@(3,0)
d04 00100
d05 00101 S0(4,2)
d06 00110
d07 00111 S0@(4,3) S1@(3,1) S2@(2,0)
d08 01000
d12 01100 S2@(4,4)
d10 01010
d14 01110 S2@(4,5) S1@(3,2)
d09 01001
d13 01101 S2@(4,6)
d11 01011
d15 01111 S2@(4,7) S1@(3,3) S0@(2,1) S3@(1,0)
d16 10000
d24 11000 S3@(4,8)
d20 10100
d28 11100 S3@(4,9) S2@(3,4)
d18 10010
d26 11010 3@(4,10)
d22 10110
d30 11110 3@(4,11) S2@(3,5) S1@(2,2)
d17 10001
d19 10011 S1@(4,12)
d25 11001
d27 11011 S1@(4,13) S3@(3,6)
d21 10101
d29 11101 S3@(4,14)
d23 10111
d31 11111 S3@(4,15) S1@(3,7) S2@(2,3) S0(1,1) S4@(0,0)

After these transformations have been made, the resulting select line loading is as follows. Select0 drives six MUX units; Select1 drives eight MUX units; Select2 drives eight MUX units; Select3 drives eight MUX units; and Select4 drives one MUX unit (the final stage MUX unit). Note that the earlier stages of the MUX circuit are now very well balanced as compared to the conventional arrangement.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A multiplexer (MUX) circuit comprising:
an initial MUX stage comprising a plurality of initial stage MUX units to receive a plurality of input bits, each of the plurality of initial stage MUX units having a respective select bit input, the initial MUX stage controlled with at least a first select bit and a second select bit assigned to the select bit inputs of the initial stage MUX units;
a final MUX stage coupled to the initial MUX stage and having a final stage MUX unit to provide one of the plurality of input bits as an output bit, the final stage MUX unit having a respective select bit input, the final MUX stage controlled with at least a third select bit assigned to the select bit input of the final stage MUX unit; and
an intermediate MUX stage coupled between the initial MUX stage and the final MUX stage, the intermediate MUX stage comprising a plurality of intermediate stage MUX units, each of the plurality of intermediate stage MUX units having a respective select bit input, the intermediate MUX stage controlled at least in part with the first select bit or the second select bit assigned to the select bit inputs of the intermediate stage MUX units.

2. The MUX circuit of claim 1, each of the plurality of initial stage MUX units realized as a 2:1 MUX, and the final stage MUX unit realized as a 2:1 MUX.

3. The MUX circuit of claim 1, further comprising a selection module coupled to the initial MUX stage and the final MUX stage to provide select bits to the plurality of initial stage MUX units and the final stage MUX unit.

4. The MUX circuit of claim 3, wherein the selection module distributes select line loading for the MUX circuit.

5. The MUX circuit of claim 3, wherein the selection module reorders fanout of MUX stages for the MUX circuit.

6. A multiplexer (MUX) circuit comprising:
an initial MUX stage comprising a plurality of initial stage MUX units to receive a plurality of input bits, the initial MUX stage controlled with a first plurality of select bits;
an intermediate MUX stage coupled to the initial MUX stage and comprising a plurality of intermediate stage MUX units controlled with a second plurality of select bits, the intermediate MUX stage controlled at least in part with a first select bit or a second select bit of the second plurality of select bits, assigned to a plurality of select bit inputs of the intermediate stage MUX units; and
a final stage MUX unit coupled to the intermediate MUX stage to provide one of the plurality of input bits as an output bit, the final stage MUX unit controlled with a final stage select bit that is distinct from any of the first plurality of select bits and any of the second plurality of select bits.

7. The MUX circuit of claim 6, further comprising at least one additional MUX stage coupled between the initial MUX stage and the intermediate MUX stage and comprising a plurality of additional stage MUX units, the at least one additional MUX stage controlled with a third plurality of select bits, wherein the final stage select bit is distinct from any of the third plurality of select bits.

8. The MUX circuit of claim 6, further comprising at least one additional MUX stage coupled between the intermediate MUX stage and the final stage MUX unit and comprising a plurality of additional stage MUX units, the at least one additional MUX stage controlled with a third plurality of select bits, wherein the final stage select bit is distinct from any of the third plurality of select bits.

9. The MUX circuit of claim 6, each of the plurality of initial stage MUX units realized as a 2:1 MUX, each of the intermediate stage MUX units realized as a 2:1 MUX, and the final stage MUX unit realized as a 2:1 MUX.

10. The MUX circuit of claim 6, further comprising a selection module coupled to the initial MUX stage, the intermediate MUX stage, and the final stage MUX unit to provide select bits to control operation of the plurality of initial stage MUX units, the plurality of intermediate stage MUX units and the final stage MUX unit.

11. The MUX circuit of claim 10, wherein the selection module distributes select line loading for the MUX circuit.

12. The MUX circuit of claim 10, wherein the selection module reorders fanout of MUX stages for the MUX circuit.

13. A multiplexer (MUX) circuit comprising:
a plurality of 2:1 MUX units coupled together in a multi-stage cascading arrangement comprising an initial MUX stage, at least one intermediate MUX stage coupled to and following the initial MUX stage, and a final MUX stage coupled to and following the at least one intermediate MUX stage, each of the MUX units controlled with a select bit input value; and
a selection module coupled to the MUX units, the selection module controlling operation of the MUX units in the initial MUX stage with a first plurality of select bits, the selection module controlling operation of the MUX units in the at least one intermediate MUX stage with a second plurality of select bits, and the selection module controlling operation of the final MUX stage with a devoted select bit;
wherein each of the plurality of 2:1 MUX units located in the at least one intermediate MUX stage comprises a select bit input;
wherein the select bit input values do not comprise the same value for each of the MUX units in the at least one intermediate MUX stage; and
wherein the at least one intermediate MUX stage is controlled at least in part with a first select bit or a second select bit assigned to the select bit inputs of each of the plurality of the intermediate MUX stage 2:1 MUX units.

14. The MUX circuit of claim 13, the devoted select bit being distinct from any of the first plurality of select bits and any of the second plurality of select bits.

15. The MUX circuit of claim 13, the first plurality of select bits and the second plurality of select bits being the same.

16. The MUX circuit of claim 13, the first plurality of select bits and the second plurality of select bits sharing at least one select bit.

17. The MUX circuit of claim 13, the first plurality of select bits and the second plurality of select bits having no common select bits.

18. The MUX circuit of claim 13, wherein the selection module distributes select line loading for the MUX circuit.

19. The MUX circuit of claim 13, wherein the selection module reorders fanout of MUX stages for the MUX circuit.

\* \* \* \* \*